United States Patent [19]

Horvath et al.

[11] 4,169,964

[45] Oct. 2, 1979

[54] ELECTRICAL SUPERCONDUCTOR

[75] Inventors: Imre Horvath, Rumlang; Kurt Kwasnitza, Glattbrugg; Gundolf Meyer, Birmenstorf, all of Switzerland

[73] Assignee: BBC Brown, Boveri & Company Limited, Baden, Switzerland

[21] Appl. No.: 823,185

[22] Filed: Aug. 9, 1977

[30] Foreign Application Priority Data

Aug. 31, 1976 [CH] Switzerland ............... 11015/76

[51] Int. Cl.² ........................................ H01B 12/00
[52] U.S. Cl. .......................... 174/15 S; 174/126 S; 174/128 S
[58] Field of Search ............... 174/128 S, 126 S, 15 S, 174/15 CA

[56] References Cited

U.S. PATENT DOCUMENTS

| | | | |
|---|---|---|---|
| 3,428,926 | 2/1969 | Bogner et al. | 174/128 S |
| 3,676,577 | 7/1972 | Martin et al. | 174/128 S X |
| 3,767,842 | 10/1973 | Bronca | 174/128 S |
| 3,910,802 | 10/1975 | Wong | 174/128 S X |
| 3,963,425 | 6/1976 | Sambrook | 174/128 S X |
| 4,079,187 | 3/1978 | Fillunger et al. | 174/128 S X |

FOREIGN PATENT DOCUMENTS

| | | | |
|---|---|---|---|
| 1665555 | 2/1971 | Fed. Rep. of Germany | 174/128 S |
| 2515904 | 9/1976 | Fed. Rep. of Germany | 174/128 S |

*Primary Examiner*—Arthur T. Grimley
*Attorney, Agent, or Firm*—Burns, Doane, Swecker & Mathis

[57] ABSTRACT

An electrical superconductor comprises in a stepwise manner single conductors and at least two stages of stranding of component cables and interstitial layers having a high resistance relative to the conductivity of the matrix material arranged between the single conductors and/or the component cables. The electrical resistance of the interstitial layers from inner twisted single conductors to the interstitial layers of the outer component cables are made progressively higher in at least two consecutive interstitial layers in order to effect a reduction in electrical losses in an economical manner.

19 Claims, 3 Drawing Figures

4,169,964

ELECTRICAL SUPERCONDUCTOR

FIELD OF THE INVENTION

The invention concerns a superconductor consisting in stepwise manner of single conductors and at least two stages of stranding of the component cables, interstitial layers of high resistance relative to the conductivity of the matrix material being arranged between the single conductors and/or the component cables.

BACKGROUND OF THE INVENTION

Superconductors for high currents have been technically established for some considerable time. Superconductors conduct a direct current without loss. However, as soon as the superconductor current fluctuates in time or the conductor is situated in a fluctuating magnetic field, losses occur which raise the operating temperature of the conductor and in so doing lower the conductivity. Furthermore, the losses have to be removed at low temperatures. Normal operating temperatures are 4.2 to 5.0 K, and permissible temperature rises usually not more than 0.3 degrees.

It is known that the losses in the superconducting material (e.g., NbTi, $Nb_3Sn$) can be reduced by dividing the superconductor into a number of filaments. The superconductor filaments are embedded in a matrix which in the case of NbTi superconductors is usually of copper or aluminum, and in the case of $Nb_3Sn$ superconductors is of a bronze with or without a copper lining. Along the filaments there flow eddy currents which at the end of the conductor cross through the matrix into other filaments and flow back in the latter. Owing to the very electrical resistance in this loop, the eddy currents persist for a long time and give rise to high losses. It is known that these losses can be reduced by twisting the conductor comprising matrix and filaments or by increasing the specific resistance of the matrix between the filaments. For technical reasons (great unit length, economy) superconductors are composed of stranded single conductors. Here, too, as in a single conductor, coupling losses occur which can be reduced by stranding the cables with a short lay. The further the filaments in a single conductor or in cables are away from each other, the higher are the losses and the tighter is the lay required. These tendencies are contradictory because thick cables cannot be twisted as sharply as thin ones.

Methods of insulating the component elements are superconductor cables from each other, or of separating them spatially with high-resistance basic supporting materials, are already known. A solution is described and illustrated in "Proc. V. Int. Conf. on Magnet, Techn.", Rome 1975. The individual wires are insulated from each other by oxide layers. This arrangement does not ensure good insulation, however, because the oxide layers are brittle and so short circuits can occur. In DT-OS No. 22 40 282 a superconductor is described which consists of a number of superconducting wires so arranged as to form a braid, and has an outer sheath which surrounds the braid, the braid inside the sheath being surrounded by a layer of plastic. Each conductor is thus completely insulated and therefore each individual conductor must remain fully operational. Cooling of the conductor is severely impeded. A strip-shaped conductor with several single conductors is described in DT-AS No. 22 56 594. Here the single conductors each contain several superconductors, they are attached to a flat side of an armour strip side by side and are arranged at a prescribed distance from each other. This arrangement provides a high-resistance connection between the individual conductors, but fixing a large number of single conductors to the base and joining them to the end conductor (and here again twisting is necessary) is uneconomical.

SUMMARY OF THE INVENTION

It is the particular object of the invention to create a superconductor of the kind stated at the beginning which reduces the electrical losses economically and in a manner adaptable to operating conditions, so that the losses can be lowered at least approximately to a value determined, for example, by the losses in the filaments.

With a superconductor consisting in stepwise manner of single conductors and at least two stages of stranding of the component cables, interstitial layers of high resistance relative to the conductivity of the matrix being arranged between the single conductors and/or the component cables, this object is achieved in that the electrical resistances of the high-resistance interstitial layers from inner twisted single conductors to the interstitial layers of the outer component cables are progressively higher in at least two consecutive interstitial layers.

The advantage of the invention lies particularly in the fact that the electrical resistance of the interstitial layers between the single conductors and/or the component cables can be so determined that the additional losses occurring in the component cables can be kept as lows as possible for the technically feasible angle of lay. The graded resistances allow the necessary angles of lay of the component to be kept within technically reasonable bounds.

It is of especial benefit if the electrical resistances of the high-resistance interstitial layers are governed by the thickness and/or the material of the high-resistance interstitial layers. This provision affords a simple way of grading the resistances. In an alternative form the high-resistance interstitial layers are composed of solder. This solution is very economical and is especially suitable for the single conductors and the inner component cables. In another alternative form the high-resistance interstitial layers are composed of a wrapped or braided high-resistance spacing wire and a layer of high-resistance solder, the smallest thickness of the solder layer being determined by the thickness of at least one spacing wire. The interstitial layers can be exactly dimensioned by this means. According to another alternative the high-resistance interstitial layers are formed by at least one high-resistance foil wrapped overlapping in one or more layers. This enables the resistance of the interstitial layer to be uniformly high over the whole circumference of the single conductor or component cable. It is of benefit if the high-resistance interstitial layers of the single conductors and/or of the inner component cables comprise a wrapped or braided high-resistance spacing wire and/or a layer of high-resistance solder, and the high-resistance interstitial of the outer component cables comprise a high-resistance foil wrapped overlapping in one or more layers. A higher resistance of the interstitial layer for the outer component cables is easily achieved in this way. It is advantageous if the superconductor is composed of inner component cables which are mechanically reduced in volume and in proportion of solder and/or are shaped, and/or of outer component cables and/or of end cables comprising the outer component cables. Reducing the proportion of solder in the conductor cross-section has the effect of increasing the relative cross-section area of the superconductor and hence the power-carrying capacity of the conductor. Shaped cables can under certain circumstances be inserted more easily. The solder is preferably an alloy of Pb-Sn or Pb-In or In-Tl, the spacing wire of a bronze or a Cu-Ni alloy or of brass or of steel or of an insulating material, and the high-resistance foil of steel strip, of a Cu-Ni alloy or of brass. It is also convenient if the spacing wire and/or the high-resistance foil are previously tinned. In this way, thorough impregnation of the conductor is achieved, and the conductor is more compact. In a further alternative form at least one of the adjacent single conductors and/or component cables is wrapped or braided with the spacing wire or wrapped with the foil. This assures adequate spacing and reduces the quantity of spacing elements. In another alternative form the component cables have copper conductors in order to improve stability. The effect of this is a short connection between the superconductor wires and the stabilising material. Full transposition of the conductor is also made possible by this means. It is of benefit if the end cable consisting of the outer component cables is embedded in a shaped copper conductor, again with a high-resistance interstitial layer between the end cable and the shaped copper conductor. The shaped copper conductor preferably contains at least one cooling duct. Another alternative provides that the end cable consisting of the outer component cables is wrapped round a cooling tube. The cooling effect is increased, but interstitial layers of higher resistance must be used, owing to the greater spacing of the superconductor filaments.

BRIEF DESCRIPTION OF DRAWINGS

Examples of the invention are shown in simplified form in the drawings, in which.

DETAILED DESCRIPTION OF PREFERRED EMBODIMENTS

Figure 1:
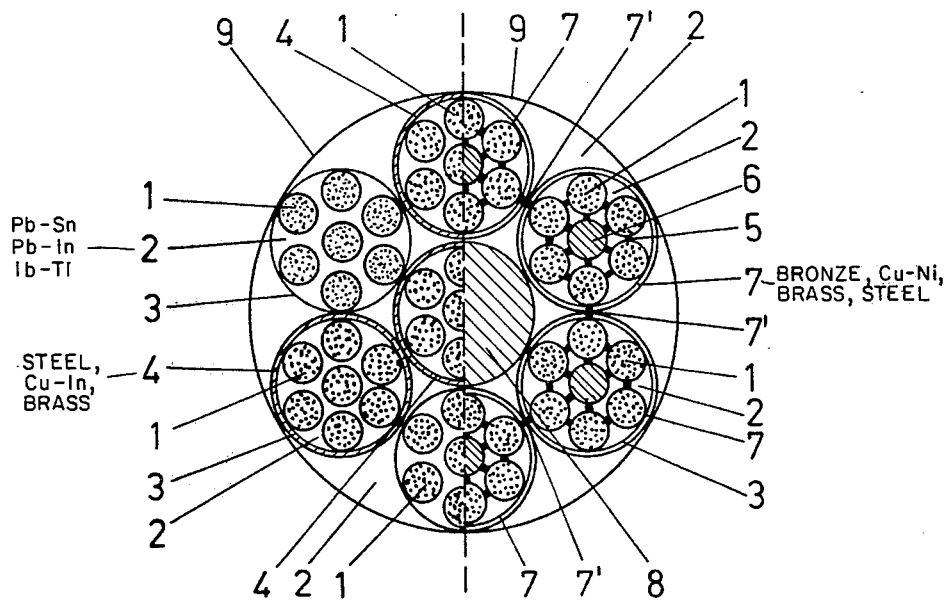
FIG. 1 shows two examples of the invention in the left-hand and right-hand halves.

In FIG. 1, single conductors with embedded filaments are identified by the number 1, a solder by the number 2, inner component cables by the number 3, foils by the number 4, spacing wires of the single conductors 1 by the number 5, copper conductors by the number 6, spacing wires of the inner component cables 3 by the number 7, points of contact of the spacing wires 7 by the number 7' and a copper conductor by the number 8. An outer component cable is denoted 9. The reference number 9 also applies to the outer component cables in FIG. 2. Foils are denoted by the number 10, spacing wires of the outer component cables 9 by the number 11, contact points of the spacing wires 11 by the number 11', a shaped copper conductor by the number 12, a cooling duct by the number 13, a solder by the number 14. A cooling tube is identified by the number 15, and a foil by the number 16.

As shown in the left-hand half of FIG. 1, the outer component cable 9 consists of seven inner component cables 3. Each inner component cable 3 contains seven single conductors 1 composed of copper conductors with embedded NbTi filaments. The single conductors 1 are previously tinned, twisted, stranded and cast in solder 2, which consists of a Pb-Sn alloy and forms the high-resistance interstitial layers between the single conductors 1. The inner component cables 3 are also cast in solder 2, and the high-resistance interstitial layers are composed of the high-resistance foil 4 which consists of a tinned steel strip. The foil 4 is applied only to each alternate cable 3 round the circumference, and to the middle cable.

In the alternative form shown by way of example in the right-hand half of FIG. 1, the high-resistance interstitial layers of the single conductors 1 and of the inner component cables 8 comprise the wrapped high-resistance spacing wires 5 and 7 and the solder 2. The spacing wire wrapped around the single conductors 1 is shown only schematically at the points of contact. The thickness of spacing wire 7 is greater than that of spacing wire 5. The spacing wires 5 and 7 are made of a Cu-Ni alloy. The middle conductors of the inner component cables 3 are composed of the copper conductors 6. Similarly, the outer component cable 9 has at its center the copper conductor 8.

Figure 2:
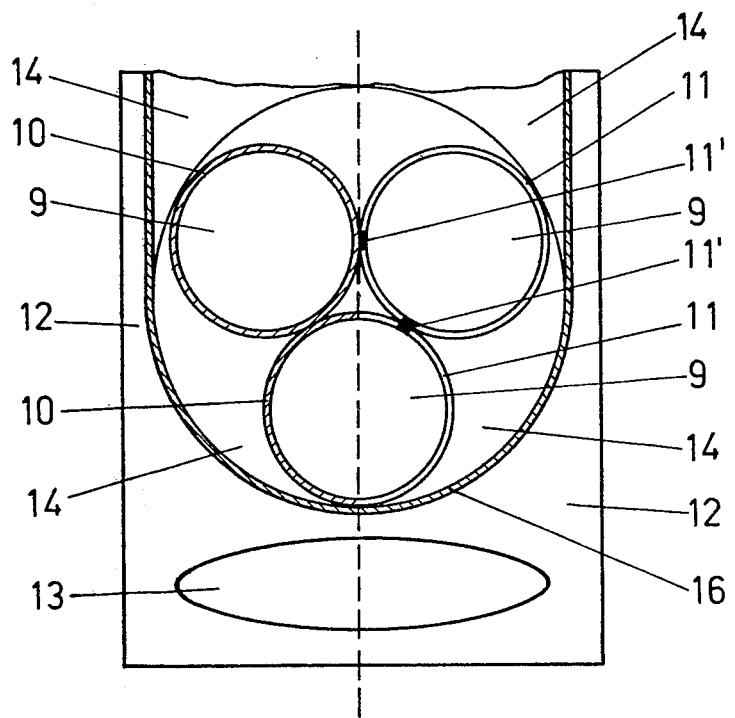
FIG. 2 shows in the left-hand and right-hand halves two examples of an end cable embedded in a shaped copper conductor in accordance with the invention.

In FIG. 2, the end cable consisting of the outer component cables 9 is embedded in the shaped copper conductor 12 and cast in solder 14. The left-hand half of FIG. 2 shows, by way of example, an alternative form in which the outer component cables 9 are wrapped with a foil 10 consisting of pre-tinned steel strip. The right-hand half shows the spacing wires 11, the contact points of which are denoted 11'. Helium flows through the cooling duct 13.

Figure 3:
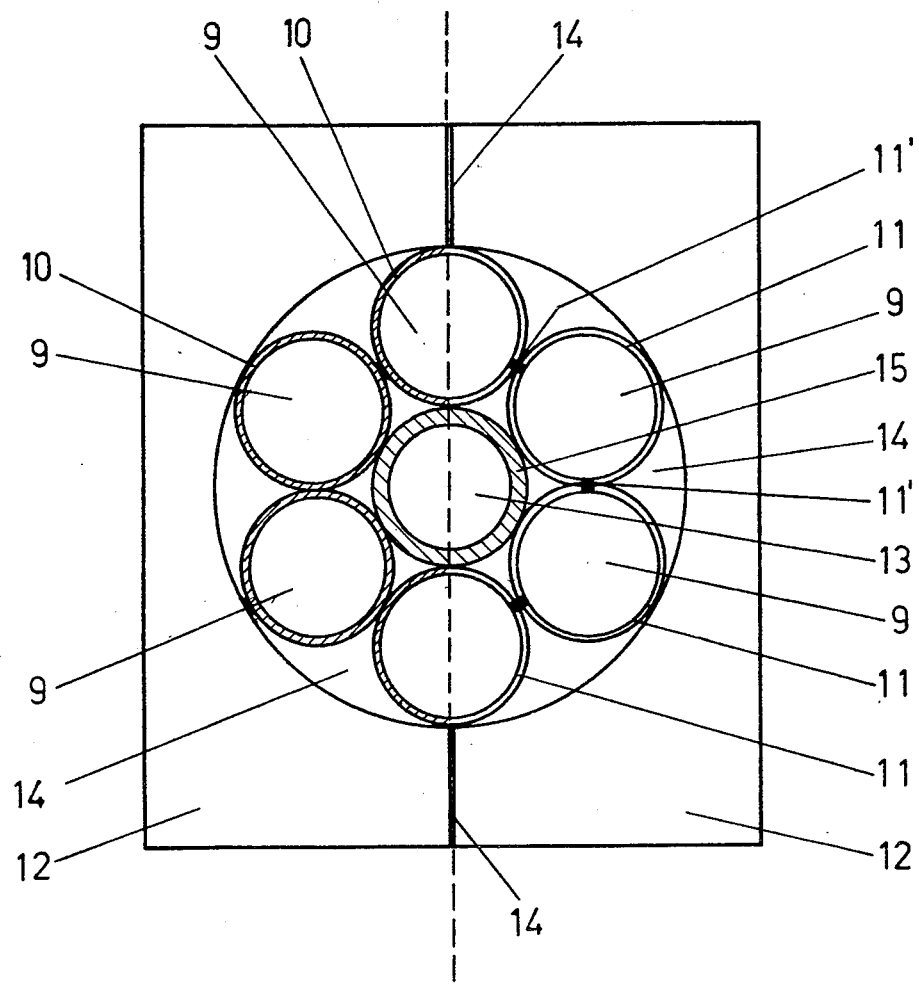
FIG. 3 illustrates two further examples of the invention.

In FIG. 3, six component cables 9 are wrapped round the cooling tube 15 and embedded in two shaped copper conductors 12. The other constructional features are the same as in FIG. 2. The shaped copper conductors 12 in FIG. 3 can also contain cooling ducts.

The electrical resistance of the high-resistance interstitial layers is understood to be the mean resistance between the superconductor filaments per unit length of conductor.

With a superconductor of NbTi, the mean specific electrical resistance to a flow of current between the superconductor filaments is about $5 \times 10^{-8}$ Ohm-cm. In the case of the inner component cable 3 the mean specific electrical resistance is required to be 5 to $10 \times 10^{-8}$ Ohm-cm, in the outer component cable 9 the corresponding value has to be $6 \times 10^{-7}$, and in the end cable approximately $10^{-6}$ Ohm-cm. In this case the additional losses in each stage of stranding would not exceed about 10% of the losses in the NbTi filaments, which are approximately $0.20\mu$ thick. These resistances can easily be achieved by, for example, providing a layer of solder approximately 10 to $20\mu$ thick between the single conductors 1 in the inner component cable 3, such a layer being formed automatically when the conductor is filled with solder. In the outer component cable it will be sufficient to space the inner component cables 3 at about $100\mu$ with a Cu-Ni wire, subsequently filling the gap with solder. In the case of the end cable, it is necessary to wrap the outer component cables 9 with a steel tape approximately $100\mu$ thick. These values are applicable for technically feasible angles of lay with a superconductor for about 10,000 A and a field variation in time of approximately 0.5 T/s.

We claim:

1. In an electrical superconductor structure comprised in stepwise manner of single conductors and at least two stages of stranding of component cables, at least one of said single conductors and component cables being arranged within an included matrix material and interstitial layers of high resistance relative to the conductivity of the included matrix material arranged between at least one of the single conductors or the component cables, the improvement wherein the electrical resistances of the high-resistance interstitial layers from inner twisted single conductors to the interstitial layers of the outer component cables are progressively higher in at least two consecutive interstitial layers.

2. An electrical superconductor as defined in claim 1 wherein the electrical resistances of said high-resistance interstitial layers are governed by at least one of the thickness or material of said high-resistance interstitial layers.

3. An electrical superconductor as defined in claim 1 wherein said high-resistance interstitial layers are composed of solder.

4. An electrical superconductor as defined in claim 1 wherein said high-resistance interstitial layers are composed of a wrapped or braided high-resistance spacing wire and a layer of high-resistance solder, the smallest thickness of said solder layer being determined by the thickness of at least one spacing wire.

5. An electrical superconductor as defined in claim 1 wherein said high-resistance interstitial layers are formed by at least one high-resistance foil overlapping wrapped with one or more layers.

6. An electrical superconductor as defined in claim 1 wherein said high-resistance interstitial layers of the single conductors, the inner component cables, or both, comprise at least one of a wrapped or braided high-resistance spacing wire or a layer of high-resistance solder, and the high-resistance interstitial layers of the outer component cables comprise a high-resistance foil overlapping wrapped with one or more layers.

7. An electrical superconductor as defined in claim 1 composed of inner component cables which are mechanically reduced in volume and in proportion of solder.

8. An electrical superconductor as defined in claim 3 in which the solder is an alloy selected from the group consisting of Pb-Sn, Pb-In and In-Tl.

9. An electrical superconductor as defined in claim 4 in which the spacing wire is formed from a material selected from the group consisting of bronze, a Cu-Ni alloy, brass and steel.

10. An electrical superconductor as defined in claim 5 wherein said high-resistance foil is made of a material selected from the group consisting of steel, a Cu-Ni alloy and brass.

11. An electrical superconductor as defined in claim 4 wherein said spacing wire is previously tinned.

12. An electrical superconductor as defined in claim 4 wherein at least one of the adjacent single conductors is wrapped or braided with said spacing wire.

13. An electrical superconductor as defined in claim 1 wherein said component cables contain copper conductors.

14. An electrical superconductor as defined in claim 1 wherein an end cable consisting of the outer component cables is embedded in a shaped copper conductor, there again being at least one high-resistance interstitial layer between the end cable and the shaped copper conductor.

15. An electrical superconductor as defined in claim 14 wherein said shaped copper conductor contains at least one cooling duct.

16. An electrical superconductor as defined in claim 1 wherein an end cable consisting of the outer component cables is wrapped around a cooling tube.

17. An electrical superconductor as defined in claim 1 in which the spacing wire is formed from an insulating material.

18. An electrical superconductor as defined in claim 5 in which high-resistance foil is previously tinned.

19. An electrical superconductor as defined in claim 5 in which said component cables are wrapped with foil.

* * * * *